(12) United States Patent
Lin et al.

(10) Patent No.: US 11,398,562 B2
(45) Date of Patent: Jul. 26, 2022

(54) MAGNETOELECTRIC SPIN ORBIT LOGIC TRANSISTOR WITH A SPIN FILTER

(71) Applicant: Intel Corporation, Santa Clara, CA (US)

(72) Inventors: Chia-Ching Lin, Portland, OR (US); Sasikanth Manipatruni, Portland, OR (US); Tanay Gosavi, Hillsboro, OR (US); Sou-Chi Chang, Portland, OR (US); Dmitri Nikonov, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 796 days.

(21) Appl. No.: 16/009,064

(22) Filed: Jun. 14, 2018

(65) Prior Publication Data

US 2019/0386120 A1 Dec. 19, 2019

(51) Int. Cl.
| | |
|---|---|
| *H01L 29/66* | (2006.01) |
| *H01L 29/82* | (2006.01) |
| *G11C 11/16* | (2006.01) |
| *H01F 10/32* | (2006.01) |

(52) U.S. Cl.
CPC ...... *H01L 29/66984* (2013.01); *G11C 11/161* (2013.01); *H01F 10/3254* (2013.01); *H01L 29/82* (2013.01); *H01F 10/3286* (2013.01)

(58) Field of Classification Search
CPC ............... H01F 10/329; H01F 10/3254; H01F 10/1936; H01F 10/3286; G11C 11/161; H01L 43/08; H01L 29/82; H01L 29/66984

USPC .......................................................... 257/252
See application file for complete search history.

(56) References Cited

U.S. PATENT DOCUMENTS

| | | | | |
|---|---|---|---|---|
| 10,447,277 | B1 * | 10/2019 | Kazemi | ................. H03K 19/20 |
| 2005/0152075 | A1 | 7/2005 | Miyazawa et al. | |
| 2014/0254256 | A1 | 9/2014 | Choi | |
| 2018/0240896 | A1 | 8/2018 | Nikonov et al. | |
| 2019/0325931 | A1 | 10/2019 | Victora et al. | |
| 2019/0386120 | A1 | 12/2019 | Lin et al. | |
| 2019/0386202 | A1 * | 12/2019 | Gosavi | .................... H01L 43/02 |
| 2019/0386208 | A1 * | 12/2019 | Lin | ......................... H01L 43/10 |

(Continued)

OTHER PUBLICATIONS

Qi, Jingshan, et al., "Giant and tunable valley degeneracy splitting in MoTe2", Phys. Rev. B 92, 121403, Year: 2015, 8 pgs.

*Primary Examiner* — Hrayr A Sayadian
(74) *Attorney, Agent, or Firm* — Essential Patents Group, LLP

(57) ABSTRACT

An apparatus is provided which comprises: a first stack comprising a magnetic insulating material (MI such as, EuS, EuO, YIG, TmIG, or GaMnAs) and a transition metal dichalcogenide (TMD such as $MoS_2$, $MoSe_2$, $WS_2$, $WSe_2$, $PtS_2$, $PtSe_2$, $WTe_2$, $MoTe_2$, or graphene; a second stack comprising an MI material and a TMD, wherein the first and second stacks are separated by an insulating material (e.g., oxide); a magnet (e.g., a ferromagnet or a paramagnet) adjacent to the TMDs of the first and second stacks, and also adjacent to the insulating material; and a magnetoelectric material (e.g., $(LaBi)FeO_3$, $LuFeO_3$, PMN-PT, PZT, AlN, or $(SmBi)FeO_3$) adjacent to the magnet.

13 Claims, 8 Drawing Sheets

(56) References Cited

U.S. PATENT DOCUMENTS

| | | |
|---|---|---|
| 2019/0386662 A1* | 12/2019 | Lin .................... H01F 10/3213 |
| 2020/0161535 A1 | 5/2020 | Lin et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2020/0402560 A1 | 12/2020 | Thirumala et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |

\* cited by examiner

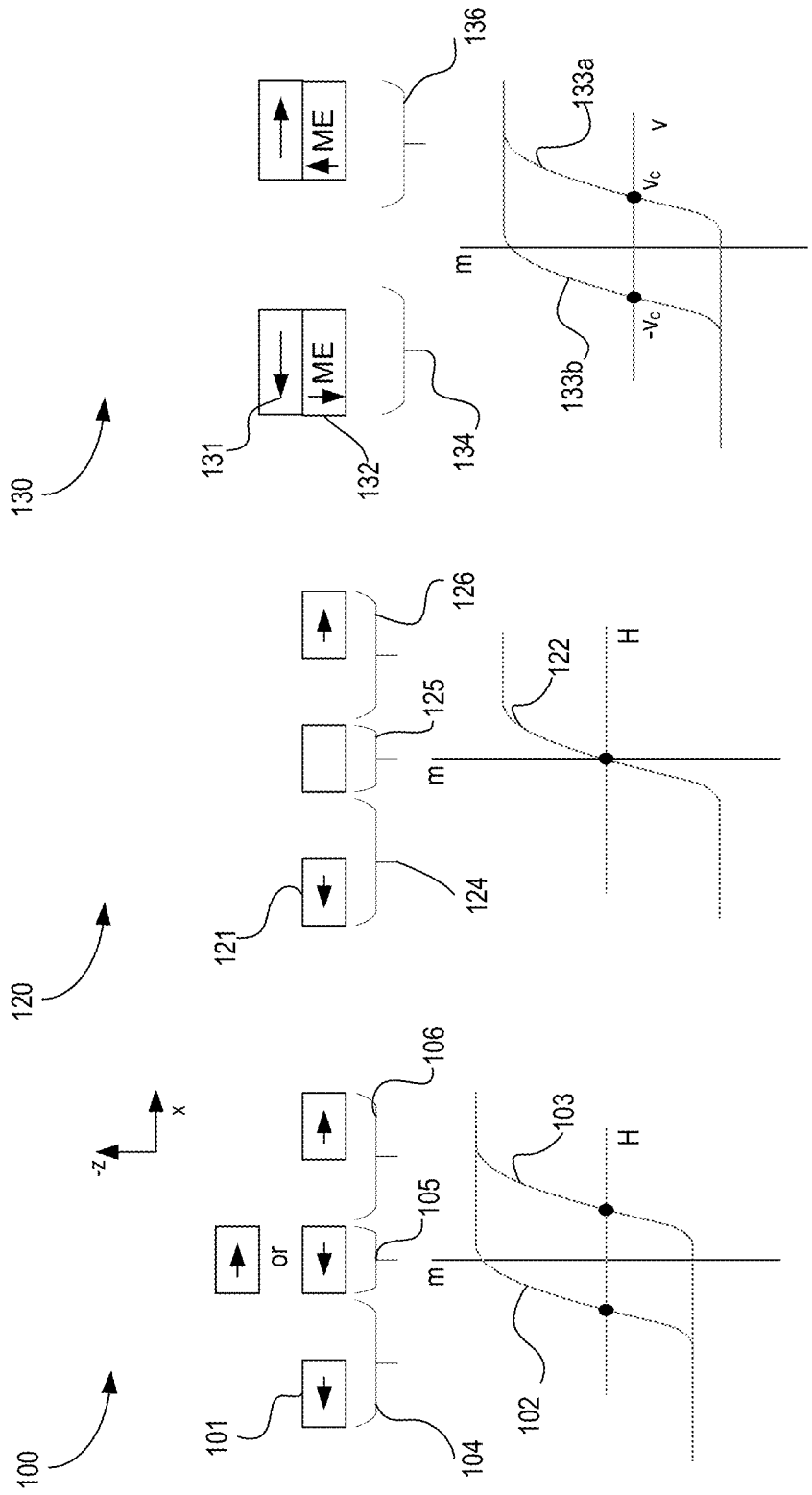

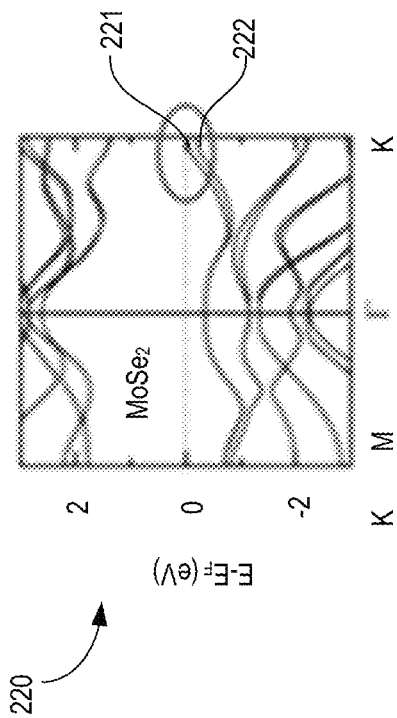
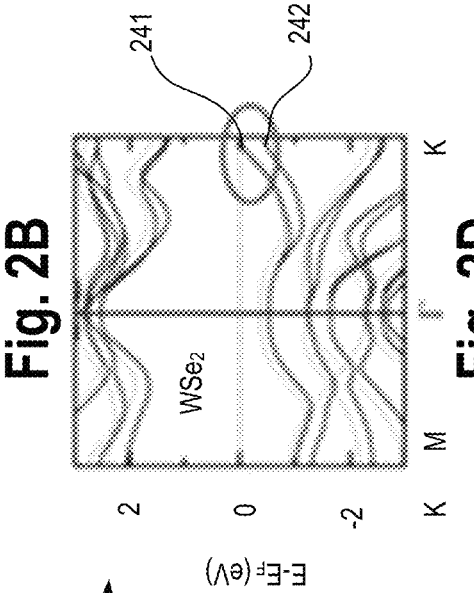
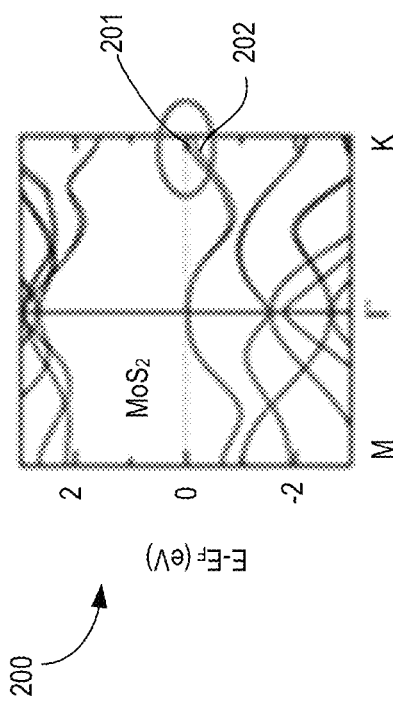
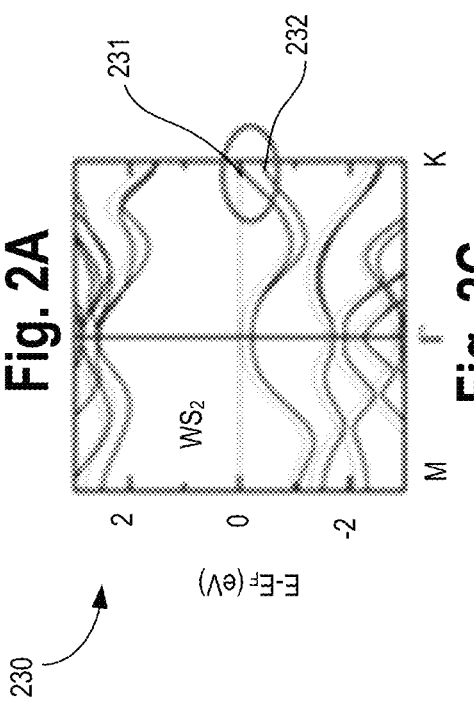

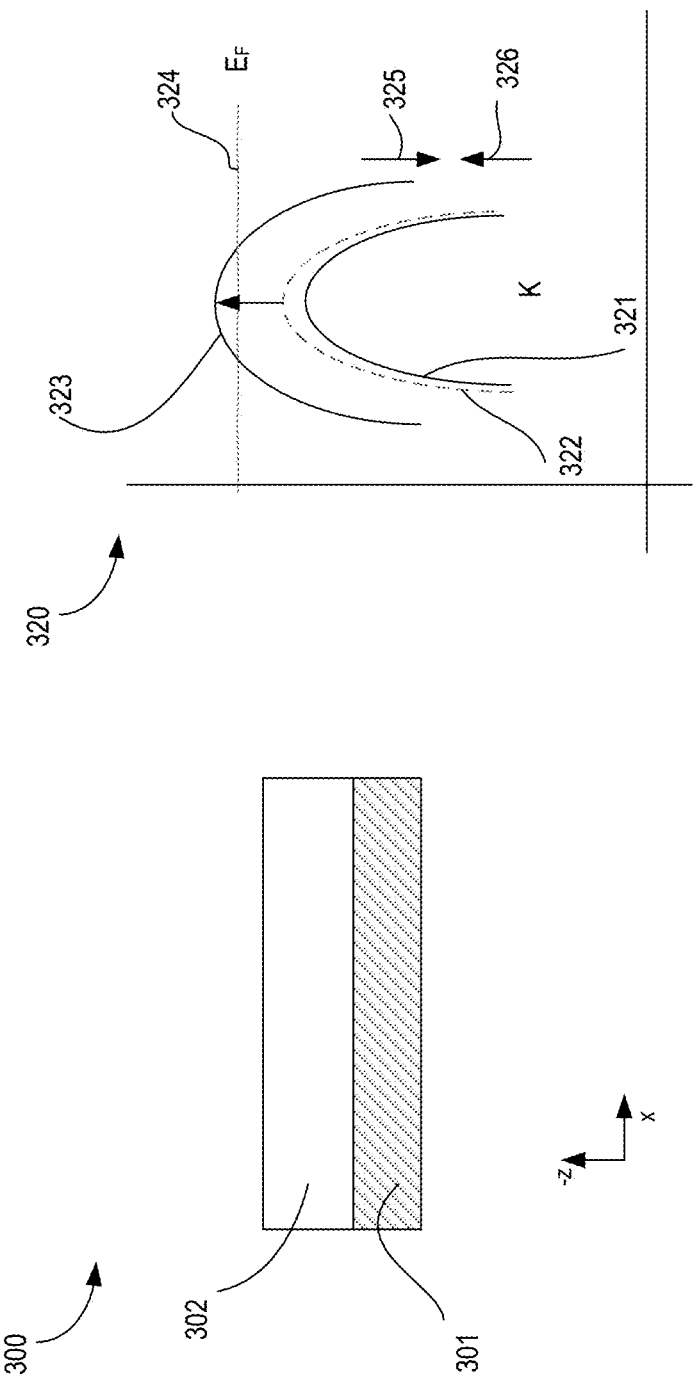

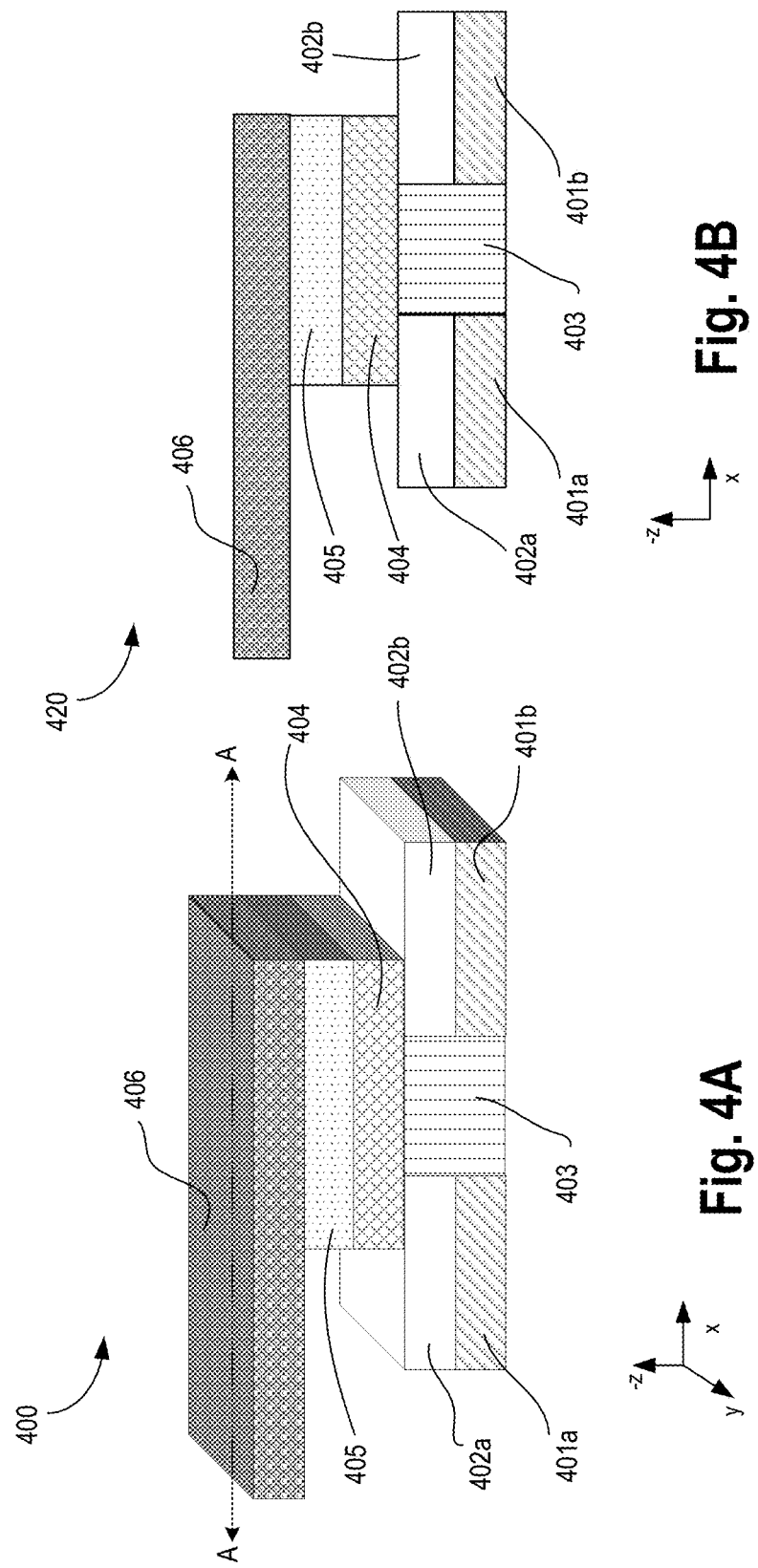

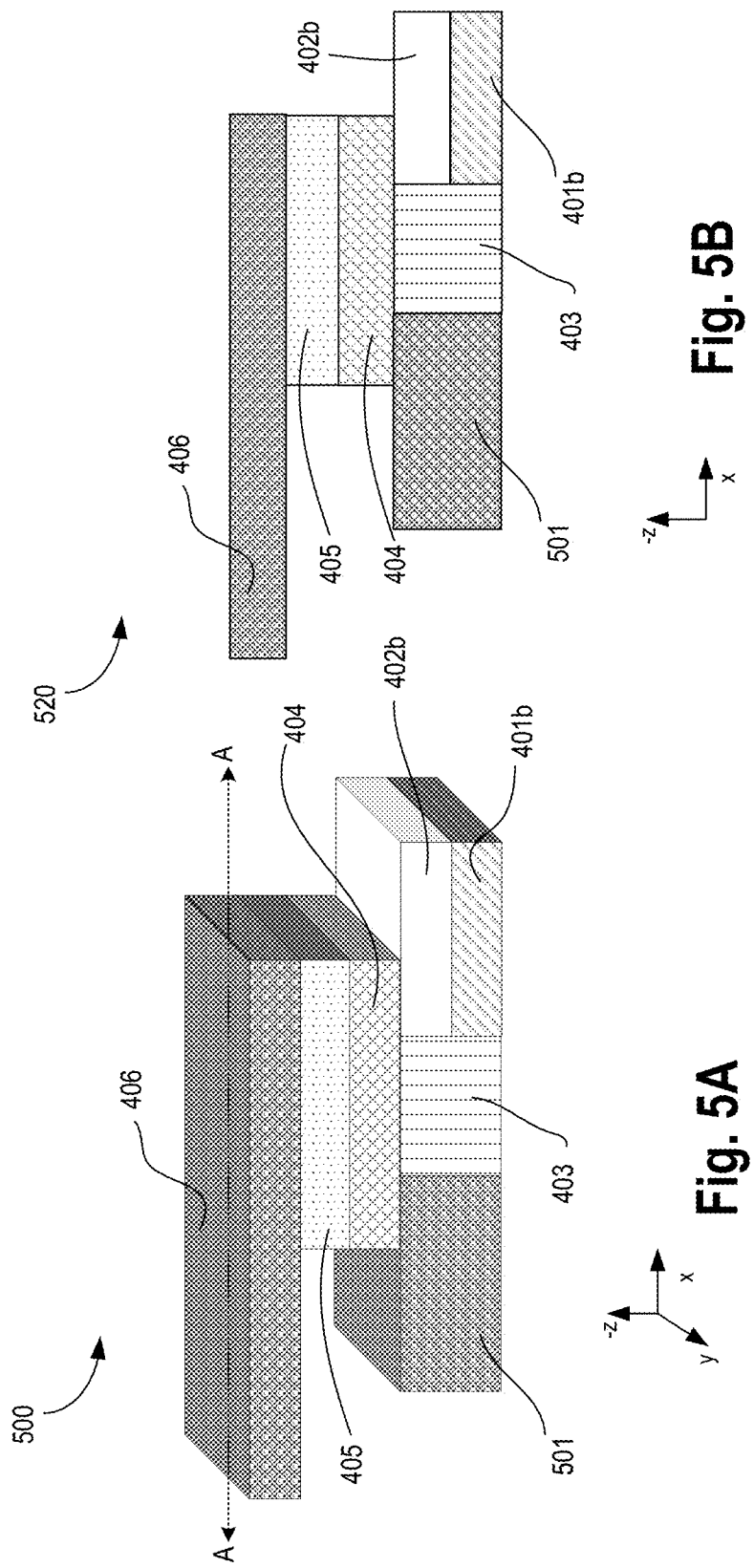

US 11,398,562 B2

MAGNETOELECTRIC SPIN ORBIT LOGIC TRANSISTOR WITH A SPIN FILTER

BACKGROUND

For a conventional Metal Oxide Semiconductor (MOS) Field Effect Transistor (MOSFET), the down-scaling of gate voltage is limited by functional thermal effect. Tunneling Field Effect Transistors (TFETs) are one alternative to MOSFETs that allow for down-scaling of the gate voltage. However, TFETs are known to have high on/off ratio, and while the gate voltage can be scaled down more than a MOSFET, the gate voltage is still higher than what is used to switch a magnetoelectric spin orbit logic (MESO) device. MESO devices use magnetoelectric (ME) effect to manipulate magnetization (and associated spin of electrons in a material) by an applied electric field. Since an estimated energy dissipation per unit area per magnet switching event through the ME effect is an order of magnitude smaller than with spin-transfer torque (STT) effect, ME materials have the capability for next-generation memory and logic applications. However, MESO devices may have more than three terminals and are challenging to integrate in a complementary metal oxide semiconductor (CMOS) process technology or CMOS-like process technology.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a magnetization response to applied magnetic field for a ferromagnet.

FIG. 1B illustrates a magnetization response to applied magnetic field for a paramagnet.

FIG. 1C illustrates a magnetization response to applied voltage field for a paramagnet connected to a magnetoelectric layer.

FIGS. 2A-D illustrate plots showing band diagrams of various transition metal dichalcogenides (TMDs).

FIG. 3A illustrates a cross-sectional view of a stack comprising a magnetic insulator and a TMD, in accordance with some embodiments.

FIG. 3B illustrates a valance band for intrinsic TMD and the stack comprising a magnetic insulator and a TMD, in accordance with some embodiments.

FIGS. 4A-B illustrate a three-dimensional view and a corresponding cross-sectional view of a three-terminal device comprising a spin filter, in accordance with some embodiments.

FIGS. 5A-B illustrate a three-dimensional view and a corresponding cross-sectional view of a three-terminal device comprising a spin filter, in accordance with some embodiments.

DETAILED DESCRIPTION

Figure 6:
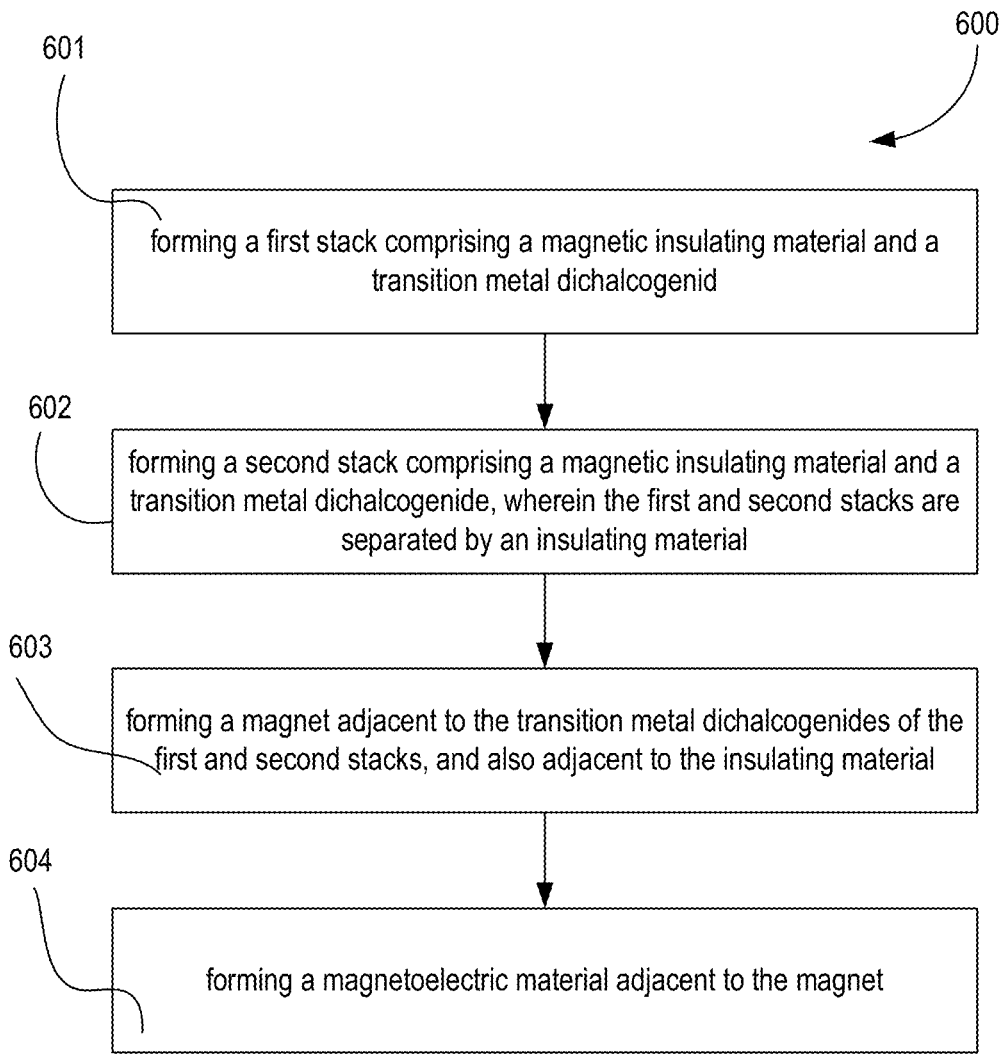
FIG. 6 illustrates a cross-section of a layout wherein the three-terminal device comprising the spin filter is positioned above a front-end of a die, in accordance with some embodiments.

Various embodiments describe a logic device that can scale down the gate voltage lower than a traditional MOSFET. In some embodiments, a magnetoelectric spin orbit logic transistor with spin filter is provided which can operate at lower gate voltages (e.g., 100 mV or lower) and have an ON/OFF ratio as high as a transition metal dichalcogenide (TMD)—based MOS transistor (e.g., approximately $10^5$). In some embodiments, a stack of transition metal dichalcogenide (TMD) and a magnetic insulator (MI) is configured as a spin-filter for a source and/or drain region of a transistor, where a magneto-electric oxide is used as a gate oxide, and a magnet is used as a channel. The resulting transistor (e.g., magnetoelectric spin orbit logic transistor with spin filter) is a MOS-like transistor structure, but with gate voltage for ON/OFF switching that can be much lower than a typical MOS transistor.

There are many technical effects of various embodiments. For example, the magnetoelectric spin orbit logic transistor with spin filter of various embodiments can scale down gate voltage (e.g., to approx. 100 mV), which is lower than TFET and similar to that of a MESO device. The magnetoelectric spin orbit logic transistor with spin filter of various embodiments is a 3-terminal device structure that results in easier process integration than TFET and MESO in a CMOS process technology or CMOS-like process technology. The On/Off ratio of the magnetoelectric spin orbit logic transistor with spin filter of various embodiments is high and on par or same as that for a TMD-based MOS transistor. The magnetoelectric spin orbit logic transistor with spin filter of various embodiments is process-integration-friendly device structure, where the stack of TMD and MI can operate as a source, drain, and and/or interconnect. The magnetoelectric spin orbit logic transistor with spin filter of various embodiments can be used to perform logic computation, neuromorphic computing, artificial intelligence (AI), and memory operations with lower power consumption than state-of-art CMOS technology. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

Here, perpendicularly magnetized magnet (or perpendicular magnet, or magnet with perpendicular magnetic anisotropy (PMA)) refers to a magnet having a magnetization which is substantially perpendicular to a plane of the magnet or a device. For example, a magnet with a magnetization which is in a z-direction in a range of 90 (or 270) degrees +/−20 degrees relative to an x-y plane of a device.

Here, an in-plane magnet refers to a magnet that has magnetization in a direction substantially along the plane of the magnet. For example, a magnet with a magnetization which is in an x or y direction and is in a range of 0 (or 180 degrees) +/−20 degrees relative to an x-y plane of a device.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

For the purposes of present disclosure, the terms "spin" and "magnetic moment" are used equivalently. More rigorously, the direction of the spin is opposite to that of the magnetic moment, and the charge of the particle is negative (such as in the case of electron).

It is pointed out that those elements of the figures having the same reference numbers (or names) as the elements of any other figure can operate or function in any manner similar to that described, but are not limited to such.

FIG. 1A illustrates a magnetization hysteresis plot 100 for ferromagnet (FM) 101. The plot shows magnetization response to an applied magnetic field for ferromagnet 101. The x-axis of plot 100 is magnetic field 'H' while the y-axis is magnetization 'm'. For FM 101, the relationship between 'H' and 'm' is not linear and results in a hysteresis loop as shown by curves 102 and 103. The maximum and minimum magnetic field regions of the hysteresis loop correspond to saturated magnetization configurations 104 and 106, respectively. In saturated magnetization configurations 104 and 106, FM 101 has stable magnetization. In the zero magnetic field region 105 of the hysteresis loop, FM 101 does not have a definite value of magnetization, but rather depends on the history of applied magnetic fields. For example, the magnetization of FM 101 in configuration 105 can be either in the +x direction or the −x direction for an in-plane FM. As such, changing or switching the state of FM 101 from one magnetization direction (e.g., configuration 104) to another magnetization direction (e.g., configuration 106) is time consuming resulting in slower nanomagnets response time. It is associated with the intrinsic energy of switching proportional to the area in the graph contained between curves 102 and 103.

In some embodiments, FM 101 is formed of CFGG (i.e., Cobalt (Co), Iron (Fe), Germanium (Ge), or Gallium (Ga) or a combination of them). In some embodiments, FM 101 comprises one or more of Co, Fe, Ni alloys and multilayer hetero-structures, various oxide ferromagnets, garnets, or Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

FIG. 1B illustrates magnetization plot 120 for paramagnet 121. Plot 120 shows the magnetization response to an applied magnetic field for paramagnet 121. The x-axis of plot 120 is magnetic field 'H' while the y-axis is magnetization 'm'. A paramagnet, as opposed to a ferromagnet, exhibits magnetization when a magnetic field is applied to it. Paramagnets generally have magnetic permeability greater or equal to one and hence are attracted to magnetic fields. Compared to plot 100, the magnetic plot 120 of FIG. 1B does not exhibit hysteresis which allows for faster switching speeds and smaller switching energies between the two saturated magnetization configurations 124 and 126 of curve 122. In the middle region 125, paramagnet 121 does not have any magnetization because there is no applied magnetic field (e.g., H=0). The intrinsic energy associated with switching is absent in this case.

In some embodiments, paramagnet 121 comprises a material which includes one or more of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, paramagnet 121 comprises dopants which include one or more of: Ce, Cr, Mn, Nb, Mo, Tc, Re, Nd, Gd, Tb, Dy, Ho, Er, Tm, or Yb. In various embodiments, the magnet can be either a FM or a paramagnet.

FIG. 1C illustrates plot 130 showing magnetization response to applied voltage field for a paramagnet 131 connected to a magnetoelectric layer 132. Here, the x-axis is voltage 'V' applied across ME layer 132 and y-axis is magnetization 'm'. Ferroelectric polarization "$P_{FE}$" in ME layer 132 is indicated by an arrow. In this example, magnetization is driven by exchange bias exerted by a ME effect from ME layer 132. When positive voltage is applied to ME layer 132, paramagnet 131 establishes a deterministic magnetization (e.g., in the +x direction by voltage $+V_c$) as shown by configuration 136. When negative voltage is applied by ME layer 132, paramagnet 131 establishes a deterministic magnetization (e.g., in the −x direction by voltage $-V_c$) as shown by configuration 134. Plot 130 shows that magnetization functions 133a and 133b have hysteresis. In some embodiments, by combining ME layer 132 with paramagnet 131, switching speeds of paramagnet as shown in FIG. 1B are achieved. In some embodiments, the hysteresis behavior of magnet 131, as shown in FIG. 1C, is associated with the driving force of switching rather than the intrinsic resistance of the magnet to switching. In some embodiments, the paramagnet 131 can be replaced with a ferromagnet such as FM 101.

FIGS. 2A-D illustrate plots 200, 220, 230, and 240, respectively, showing band diagrams of various transition metal dichalcogenides (TMDs). In TMDs such as $MoS_2$, $MoSe_2$, $WS_2$, and $WSe_2$, the strong spin-orbit interaction originating from the transition metal ion's d orbitals introduces a spin split in the valence bands. The difference is the degree of spit depends on the material for TMD. For plot 200, the spin split for $MoS_2$ is shown by spin-up 201 and spin-down 202. For plot 220, the spin split for $MoSe_2$ is shown by spin-up 221 and spin-down 222. For plot 230, the spin split for $WS_2$ is shown by spin-up 231 and spin-down 232. For plot 240, the spin split for $WSe_2$ is shown by spin-up 241 and spin-down 242. It should be noted that the spin-up and spin-down directions are labeled for explanation purposes, and that their labels can be reversed. For example, 221 illustrates spin-down while 222 illustrates spin up.

FIG. 3A illustrates a cross-sectional view 300 of a stack comprising a magnetic insulator MI 301 and a TMD 302, in accordance with some embodiments. In some embodiments, MI 301 comprises one or more of: EuS (europium sulfide), EuO (europium oxide), YIG (Yttrium iron garnet such as $Y_3Fe_5O_{12}$), TmIG (thulium iron garnet such as $Tm_3Fe_5O_{12}$), or GaMnAs (Gallium manganese arsenide). In some embodiments, TMD 302 comprises one or more of: $MoS_2$ (Molybdenum disulfide), $MoSe_2$ (Molybdenum diselenide) $WS_2$ (Tungsten disulfide), $WSe_2$ (Tungsten diselenide), $PtS_2$ (Platinum disulfide), $PtSe_2$ (Platinum diselenide), $WTe_2$ (Tungsten Ditelluride), $MoTe_2$ (Molybdenum Ditelluride), or graphene.

FIG. 3B illustrates plot 320 showing valance band for intrinsic TMD and the stack comprising a MI and a TMD, in accordance with some embodiments. Here, three valance bands are shown where valance band 321 is one of a spin-split sub-band, valance band 322 is the other spin-split sub-band for an intrinsic TMD, and valance band 323 is the lift of valance band 322 for the stack comprising MI 31 and TMD 302. The valance band 323 rises above valance bands 322 and 321, and over or close to the Fermi energy level $E_F$ 324 resulting in a clear or pronounced split of spin-down 325 and spin-up 326 orientations. In one example, valley-splitting of over 300 meV is seen for $MoTe_2$ and EuO stacked materials. This clear split of spin-down 325 and spin-up 326 orientations is largely because of the MI layer 301 when combined with TMD 302 to form a stack. This stack can be used as a spin filter. As such, in a TMD/MI stack, if spin splitting is large enough, it allows to transport charge current with one specific spin polarization. For example, if valance band with spin "up" is lifted in a TMD/MI stack, charge current with spin "up" can flow through, but charge current with spin "down" cannot flow through.

In some embodiments, magneto-electric and valley splitting effects are combined forming a device as those discussed with reference to FIGS. 4-5.

FIGS. 4A-B illustrate a three-dimensional view 400 and a corresponding cross-sectional view 420, respectively, of a three-terminal device comprising a spin filter, in accordance with some embodiments. Three dimensional view 400 illustrates a spin filter which comprises a drain region (a first terminal) having a stack comprising MI 401a and TMD 402a; a source region (a second terminal) having a stack comprising MI 401b and TMD 402b; separation region 403; gate region (a third terminal) having a stack comprising free magnet 404 and magnetoelectric layer 405; and interconnect 406 coupled to a layer of the gate region stack.

In some embodiments, MI 401a/b comprises one or more of: EuS (europium sulfide), EuO (europium oxide), YIG (Yttrium iron garnet such as $Y_3Fe_5O_{12}$), TmIG (thulium iron garnet such as $Tm_3Fe_5O_{12}$), or GaMnAs (Gallium manganese arsenide). In some embodiments, TMD 402a/b comprises one or more of: $MoS_2$ (Molybdenum disulfide), $MoSe_2$ (Molybdenum diselenide) $WS_2$ (Tungsten disulfide), $WSe_2$ (Tungsten diselenide), $PtS_2$ (Platinum disulfide), $PtSe_2$ (Platinum diselenide), $WTe_2$ (Tungsten Ditelluride), $MoTe_2$ (Molybdenum Ditelluride), or graphene. In some embodiments, separation region 403 is an insulating material such as an oxide, which separates the drain region from the source region.

In some embodiments, a gate region is formed over the separation region 403 such that part of the gate region is adjacent the drain region and part of the gate region is adjacent to the source region. In some embodiments, free magnet 404 is adjacent to part of portion of the TMD 402a/b and the separation region 403. In some embodiments, ME layer 405 is formed over the free magnet 404 and is adjacent to it. In some embodiments, the interconnect 406 is formed over the ME layer 405. In various embodiments, free magnet 404 behaves as a channel In some embodiments, ME layer 405 acts as a gate oxide.

In some embodiments, free magnet 404 has saturated magnetization $M_s$ and effective anisotropy field $H_k$. Saturated magnetization $M_s$ is generally the state reached when an increase in applied external magnetic field H cannot increase the magnetization of the material. Anisotropy $H_k$ generally refers material properties that are highly directionally dependent.

In some embodiments, free magnet 404 is a ferromagnet (FM) which includes materials such as: of CFGG (i.e., Cobalt (Co), Iron (Fe), Germanium (Ge), or Gallium (Ga) or a combination of them). In some embodiments, FM 404 comprises one or more of Co, Fe, Ni alloys and multilayer hetero-structures, various oxide ferromagnets, garnets, or Heusler alloys. For example, CoFeB, FeB, CoFe, LaSrMoO₃(LSMO), Co/Pt, CoFeGd, and ferromagnetic semi-metal such as Weyl material(s), and Heusler alloy(s) such as $Cu_2MnAl$, $Cu_2MnIn$, $Cu_2MnSn$ can be used for FM 404. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, free magnet 404 is a paramagnet. Paramagnets are non-ferromagnetic elements with strong paramagnetism which have high number of unpaired spins but are not room temperature ferromagnets. A paramagnet, as opposed to a ferromagnet, exhibits magnetization when a magnetic field is applied to it. In some embodiments, the paramagnet comprises a material which includes one or more of: Platinum(Pt), Palladium (Pd), Tungsten (W), Cerium (Ce), Aluminum (Al), Lithium (Li), Magnesium (Mg), Sodium (Na), $Cr_2O_3$ (chromium oxide), CoO (cobalt oxide), Dysprosium (Dy), $Dy_2O$ (dysprosium oxide), Erbium (Er), $Er_2O_3$ (Erbium oxide), Europium (Eu), $Eu_2O_3$ (Europium oxide), Gadolinium (Gd), Gadolinium oxide ($Gd_2O_3$), FeO and $Fe_2O_3$ (Iron oxide), Neodymium (Nd), $Nd_2O_3$ (Neodymium oxide), $KO_2$ (potassium superoxide), praseodymium (Pr), Samarium (Sm), $Sm_2O_3$ (samarium oxide), Terbium (Tb), $Tb_2O_3$ (Terbium oxide), Thulium (Tm), $Tm_2O_3$ (Thulium oxide), or $V_2O_3$ (Vanadium oxide). In some embodiments, the paramagnet comprises dopants which include one or more of: Ce, Cr, Mn, Nb, Mo, Tc, Re, Nd, Gd, Tb, Dy, Ho, Er, Tm, or Yb.

In some embodiments, free magnet 404 is an insulating or semi-insulating magnet, which comprises a material that includes one or more of: Co, Fe, No, or O. In some embodiments, the insulating or semi-insulating magnet comprises a material which includes one or more of: $Co_2O_3$, $Fe_2O_3$, $Co_2FeO_4$, or $Ni_2FeO_4$. In some embodiments, the insulating or semi-insulating magnet has Spinel crystal structure.

In some embodiments, free magnet 404 comprises at least two free magnets that are coupled by a coupling layer. In some embodiments, the coupling layer comprises one or more of: Ru, Os, Hs, Fe, or other similar transition metals from the platinum group of the periodic table. In some embodiments, the coupling layer(s) are removed so that the free magnets of the free magnet structure or stack are directly connected with one another forming a single magnet (or a composite magnet). A composite magnet may be a super lattice including a first material and a second material, wherein the first material includes one of: Co, Ni, Fe, or Heusler alloy, and wherein the second material includes one of: Pt, Pd, Ir, Ru, or Ni.

In some embodiments, ME layer 405 is a structure that comprises a material which includes one of: $Cr_2O_3$ and multiferroic material. In some embodiments, ME layer 405 comprises Cr and O. In some embodiments, the multiferroic material comprises BFO (e.g., BiFeO$_3$), LFO (LuFeO$_2$, LuFe$_2$O$_4$), or La doped BiFeO$_3$. In some embodiments, the multiferroic material includes one of: Bi, Fe, O, Lu, or La. In some embodiments, ME layer 405 comprises one of: dielectric, para-electric, or ferro-electric material. Other examples of magneto-electric and/or magneto-strictive material for ME layer 405 include (LaBi)FeO$_3$ (Lanthanum doped bismuth ferrite), LuFeO$_3$, PMN-PT (lead magnesium niobate-lead titanate), PZT (lead zirconate titanate), AlN (aluminum nitride), or (SmBi)FeO$_3$ (Sm doped bismuth ferrite). In some embodiments, interconnect 406 comprises one or more of: Cu, Al, Au, Ag, or graphene.

While growing MI material for MI 401*a/b*, a growing magnetic field is applied, which can force magnetization of MI point to the same direction. Due to the valley splitting effect as described with reference to FIG. 3B, the stacks of MI 401*a/b* and TMD 402*a/b* becomes a spin filter.

In some embodiments, by applying a gate voltage from top interconnect 406, the magnetization of magnet 404 can be manipulated by ME gate oxide of ME layer 405 through magneto-electric effect or magneto-strictive effect. In some embodiments, when magnet 404 and the stack of MI 401*a/b* and TMD 402*a/b* have the same spin polarization, the transistor (or spin filter device) is on. When the transistor is on, current from the drain region to the source region can propagate through magnet 404. For example, when 401*a*/402*a* receives spin-down current and the stack of MI 401*a* and TMD 402*a* is configured to only pass spin-down current, then the spin-down current flows through magnet 404 into the source region. In this example, the magnetization of magnet 404 is in the same plane as the magnetization of MI 401*a*.

In some embodiments, when magnet 404 and the stack of MI 401*a/b* and TMD 402*a/b* have the opposite spin polarizations, the transistor (or spin filter device) is off. Continuing with the same example, when MI 401*a* receives spin-up current and the stack of MI 301*a* and TMD 402*a* is configured to only pass spin-down current, then the spin-up current does not flow through magnet 404 into the source region. In other words, spin-up current is filtered by the stack of MI 301*a* and TMD 402*a*.

For ME switching, the gate voltage can be scaled down to 100 mV or lower, while the ON/OFF ratio can be potentially similar to the ON/OFF ration of TMD-based MOS device, which is roughly 10$^5$.

In some embodiments, magnet 404 is an in-plane magnet and MI 401*a* is also an in-plane magnetic insulator. In some embodiments, magnet 404 is an out-of-plane magnet and MI 401*a* is also an out-of-plane magnetic insulator. The thickness of a magnet 404 may determine its equilibrium magnetization direction. For example, when the thickness of the magnet 404 is above a certain threshold (depending on the material of the magnet, e.g. approximately 1.5 nm for CoFe), then the ferromagnetic layer exhibits magnetization direction which is in-plane. Likewise, when the thickness of magnet 404 is below a certain threshold (depending on the material of the magnet), then the magnet 404 exhibits magnetization direction which is perpendicular to the plane of the device.

Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC (face centered cubic lattice), BCC (body centered cubic lattice), or L1$_0$-type of crystals, where L1$_0$ is a type of crystal class which exhibits perpendicular magnetization), can also determine the direction of magnetization.

L1$_0$ is a crystallographic derivative structure of an FCC (face centered cubic lattice) structure and has two of the faces occupied by one type of atom and the corner and the other face occupied with the second type of atom. When phases with the L1$_0$ structure are ferromagnetic the magnetization vector usually is along the [0 0 1] axis of the crystal. Examples of materials with L1$_0$ symmetry include CoPt and FePt. Examples of materials with tetragonal crystal structure and magnetic moment are Heusler alloys such as CoFeAl, MnGe, MnGeGa, and MnGa.

In some embodiments, when magnet 404 is a perpendicular magnet (e.g., magnet with out-of-plane magnetization relative to a plane of a device), magnet 404 may comprise a stack of materials, wherein the materials for the stack are selected from a group consisting of: Co and Pt; Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, and MgO; Mn$_x$Ga$_y$; materials with L1$_0$ symmetry; and materials with tetragonal crystal structure. In some embodiments, perpendicular magnet 404 is a magnet with PMA (perpendicular magnetic anisotropy) formed of a single layer of one or more materials. In some embodiments, the single layer comprises of MnGa.

FIGS. 5A-B illustrate another three-dimensional view 500 and a corresponding cross-sectional view 520, respectively, of a three-terminal device comprising a spin filter, in accordance with some embodiments. The three-terminal device of FIGS. 5A-B is similar to the three-terminal device of FIGS. 4A-B, but for the structure of the drain region. In some embodiments, either the source or drain region may just comprise an interconnect instead of the stacked material discussed with reference to FIGS. 4A-B. Here, the drain region comprises interconnect 501 while the source region is same as that of FIGS. 4A-B. However, the same concept can apply when the source region comprises an interconnect while the drain regions comprises a stack of MI and TMD as discussed with reference to FIGS. 4A-B. In various embodiments, interconnect 501, which is partially adjacent to separation region 403 and magnet 404, comprises of the same material as that of interconnect 406. In some embodiments, interconnect 501 comprises one or more of: Cu, Al, Au, Ag, CNT (carbon nanotube), or graphene.

In one example, when the stack of MI 401*b* and TMD 402*b* of the source region are configured to allow one direction of spin flow (e.g., spin-down), then when magnet 404 produces spin-up current, then no current flows through the source region. In other words, in this example, the source terminal does not provide any current because the MI 401*b* and TMD 402*b* stack is configured to only pass spin-down current.

FIG. 6 illustrates flowchart 600 of a method for forming a three-terminal device comprising a spin filter, according to some embodiments of the disclosure. At block 601, the method comprises forming a first stack comprising a magnetic insulating material 401*a* and a transition metal dichalcogenide 402*a*.

At block 602, the method comprises forming a second stack comprising a magnetic insulating material 401*b* and a transition metal dichalcogenide 402*b*, wherein the first and second stacks are separated by an insulating material 403 (or separation region). In some embodiments, the magnetic insulating material of the first or second stacks comprises one or more of: Eu, S, O, Y, Fe, Tm, Ga, Mn, or As. In some embodiments, the transition metal dichalcogenide of the first or second stacks comprises one or more of: Mo, S, Se, W, Pt, Te, or graphene.

At block 603, the method comprises forming a magnet 404 (e.g., free magnet) adjacent to the transition metal dichalcogenides of the first and second stacks, and also adjacent to the insulating material. In some embodiments, magnet 404 comprises a material which includes one or more of: Co, Fe, Ni, or O. In some embodiments, magnet 404 is one of a paramagnet or ferromagnet. In some embodiments, magnet 404 comprises a material which includes one or more of: Pt, Pd, W, Ce, Al, Li, Mg, Na, Cr, O, Co, Dy, Er, Eu, Gd, Fe, Nd, K, Pr, Sm, Tb, Tm, or V. In some embodiments, magnet 404 comprises one or a combination of materials which includes one or more of: a Heusler alloy, Co, Fe, Ni, Gd, B, Ge, Ga, permalloy, or Yttrium Iron Garnet (YIG), and wherein the Heusler alloy is a material which includes one or more of: Cu, Mn, Al, In, Sn, Ni, Sb, Ga, Co, Fe, Si, Pd, Sb, Si, V, or Ru.

At block 604, the method comprises forming a magnetoelectric material 405 adjacent to the magnet. In some embodiments, the magnetoelectric material includes one of: Cr, O, or multiferroic material, and wherein the multiferroic material comprises one or more of: Bi, Fe, O, Lu, or La. In some embodiments, the magnet and the magnetic insulating material have in-plane magnetic anisotropy. In some embodiments, the magnet and the magnetic insulating material have perpendicular magnetic anisotropy.

In some embodiments, the method comprises forming an interconnect 406 adjacent to the magnetoelectric material, wherein the interconnect comprises a material which includes one or more of: Cu, Ag, Al, Au, or graphene.

Figure 7:
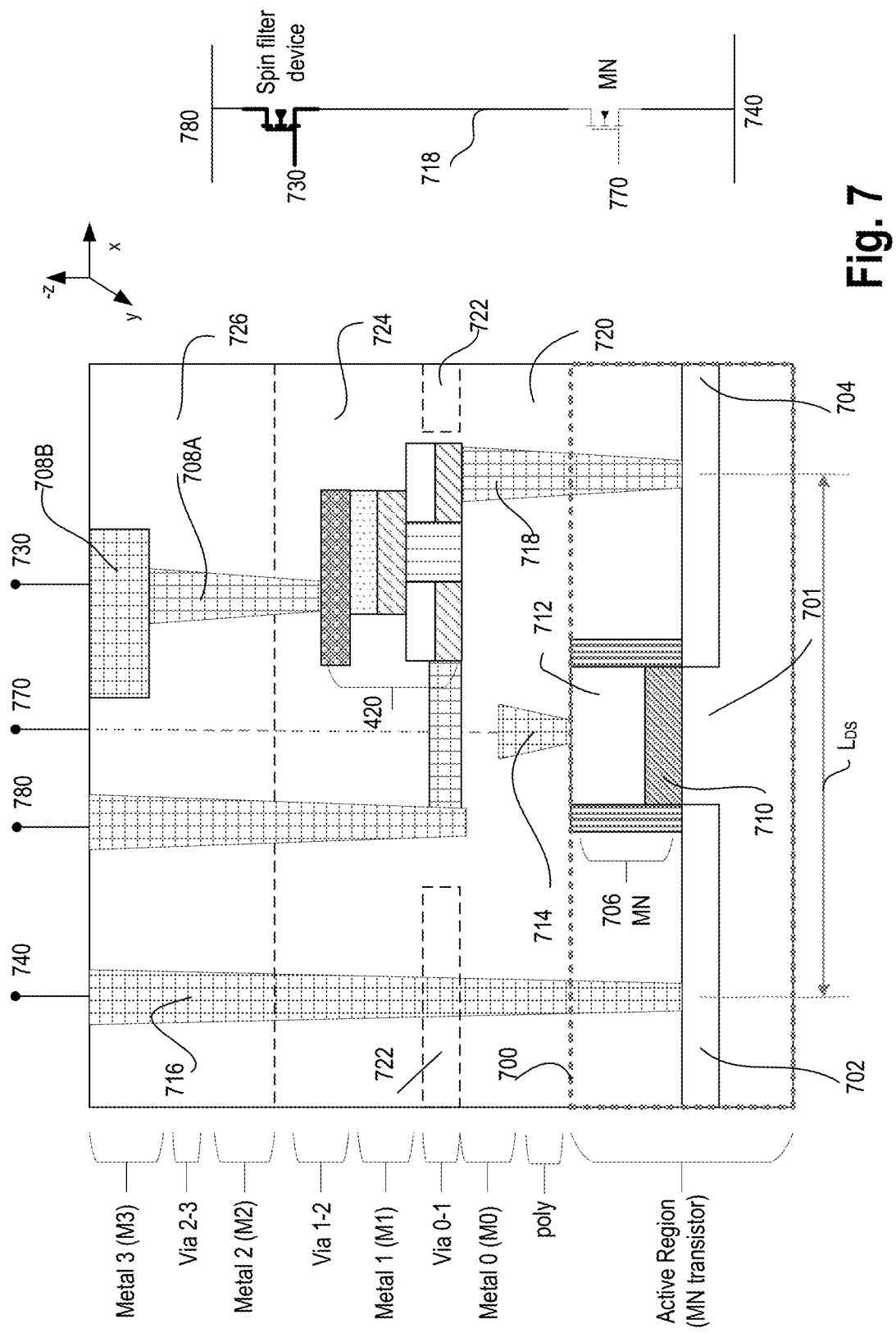
FIG. 7 illustrates a flowchart of a method for forming a three-terminal device comprising a spin filter, according to some embodiments of the disclosure.

FIG. 7 illustrates a cross-section of a layout wherein the three-terminal device comprising the spin filter is positioned above a front-end of a die that has a transistor 700, in accordance with some embodiments.

In an embodiment, transistor 700 has a source region 702, a drain region 704 and a gate 706. The transistor 700 (e.g., n-type transistor MN) further includes a gate contact 714 disposed above and electrically coupled to the gate 706, a source contact 716 disposed above and electrically coupled to the source region 702, and a drain contact 718 disposed above and electrically coupled to the drain region 704. In some embodiments, a 3-terminal spin filter device such as the device discussed with reference to FIGS. 4-5 is disposed above the transistor 700. In some embodiments, the source region of the spin filter device is disposed on the drain contact 718 of the transistor 700. The gate region of 3-terminal spin filter device is coupled to electrode 730 through via and interconnect 708a/b. The drain region of the 3-terminal spin filter device is couple to electrode 780.

In some embodiments, the gate contact 714 is directly below an interconnect coupled to the drain region of the spin filter device. The gate contact 714 of transistor 700 is coupled to electrode 770. In some embodiments, a contact is disposed onto the gate contact 714 on a second y-z plane behind (into the page) the first y-z plane of the electrode 722. In some embodiments, electrode 722 that may not contact the word-line contact is disposed on the gate electrode 712.

In some embodiments, transistor 700 associated with substrate 701 is a metal-oxide-semiconductor field-effect transistor (MOSFET or simply MOS transistors), fabricated on the substrate 701. In various embodiments of the present disclosure, the transistor 700 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. In an embodiment, the transistor 700 is a tri-gate transistor.

In some embodiments, the underlying substrate 701 represents a surface used to manufacture integrated circuits. In some embodiments, the substrate 701 includes a suitable semiconductor material such as but not limited to, single crystal silicon, polycrystalline silicon and silicon on insulator (SOI). In another embodiment, the substrate 701 includes other semiconductor materials such as germanium, silicon germanium, or a suitable group III-V or group III-N compound. The substrate 701 may also include semiconductor materials, metals, dopants, and other materials commonly found in semiconductor substrates.

In some embodiments, the transistor 700 includes a gate stack formed of at least two layers, a gate dielectric layer 710 and a gate electrode layer 712. The gate dielectric layer 710 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 710 to improve its quality when a high-k material is used.

The gate electrode layer 712 of the transistor 700 is formed on the gate dielectric layer 710 and may comprise of at least one P-type work-function metal or N-type work-function metal, depending on whether the transistor is to be a PMOS or an NMOS transistor. In some embodiments, the gate electrode layer 712 may comprise of a stack of two or more metal layers, where one or more metal layers are work-function metal layers and at least one metal layer is a conductive fill layer.

For a PMOS transistor, metals that may be used for the gate electrode layer 712 include, but are not limited to, ruthenium, palladium, platinum, cobalt, nickel, and conductive metal oxides, e.g., ruthenium oxide. A P-type metal layer will enable the formation of a PMOS gate electrode layer 712 with a work-function that is between about 4.9 eV and about 5.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 712 with a work-function that is between about 3.9 eV and about 4.2 eV.

In some embodiments, the gate electrode layer 712 may comprise a "U"-shaped structure that includes a bottom portion substantially parallel to the surface of the substrate and two sidewall portions that are substantially perpendicular to the top surface of the substrate. In another embodiment, at least one of the metal layers that form the gate electrode layer 712 may simply be a planar layer that is substantially parallel to the top surface of the substrate and does not include sidewall portions substantially perpendicular to the top surface of the substrate. In some embodiments of the present disclosure, the gate electrode layer 712 may comprise of a combination of U-shaped structures and planar, non-U-shaped structures. For example, the gate electrode layer 712 may comprise of one or more U-shaped metal layers formed atop one or more planar, non-U-shaped layers.

In some embodiments, a pair of gate dielectric layer 710 may be formed on opposing sides of the gate stack that bracket the gate stack. The gate dielectric layer 710 may be formed from a material such as silicon nitride, silicon oxide, silicon carbide, silicon nitride doped with carbon, and silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 702 and drain region 704 are formed within the substrate adjacent to the gate stack of the transistor 700. The source region 702 and drain region 704 are generally formed using either an implantation/diffusion process or an etching/deposition process. In the former process, dopants such as boron, aluminum, antimony, phosphorous, or arsenic may be ion-implanted into the substrate to form the source region 702 and drain region 704. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 702 and drain region 704. In some embodiments, the source region 702 and drain region 704 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 702 and drain region 704 may be formed using one or more alternate semiconductor materials such as germanium or a suitable group III-V compound. In some embodiments, one or more layers of metal and/or metal alloys may be used to form the source region 702 and drain region 704.

In some embodiments, the gate contact 714 and drain contact 718 of the transistor 700 are disposed in a first dielectric layer 720 disposed above the substrate 701. In some embodiments, the spin filter device 420 is disposed in a second dielectric layer 724 disposed on the first dielectric layer 720. In some embodiments, a third dielectric layer 726 is disposed on the second dielectric layer 722. In some embodiments, a fourth dielectric layer 726 is disposed on the third dielectric layer 724. In some embodiments, a source contact 716 (coupled to electrode 740) is partially disposed in the fourth dielectric layer 726, partially disposed in the third dielectric layer 726, partially disposed in the second dielectric layer 722 and partially disposed on the first dielectric layer 720. In some embodiments, the spin filter electrode contact 708*a* is disposed in the third dielectric layer 726. In some embodiments, the conductive interconnect structure such as conductive interconnect structure 708*a/b* disposed in the third dielectric layer 726.

In some embodiments, the gate contract 714 is formed in poly region; drain contract 718 is formed in active, poly, and Metal 0 (M0); spin filter device is formed in Metal 1 (M1) and Via 1-2; contract 708*a* is formed in Metal 2 (M2) and Via 2-3; and conductor 708B is formed in Metal 3 (M3). In some embodiments, the spin filter device 420 is formed in the metal 3 (M3) region.

In some embodiments, an n-type transistor MN is formed in the frontend of the die while the spin filter device 420 is located in the backend of the die. Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). In some embodiments, the spin filter device 420 is located in the backend metal layers or via layers for example in Via 3. In some embodiments, the electrical connectivity to the device is obtained in layers M0 and M4 or M1 and M5 or any set of two parallel interconnects. In some embodiments, the spin filter device 420 is formed in metal 2 (M2) and metal 1 (M1) layer region and/or Via 1-2 region. In some embodiments, the spin filter device 420 is formed in the metal 1 region.

Figure 8:
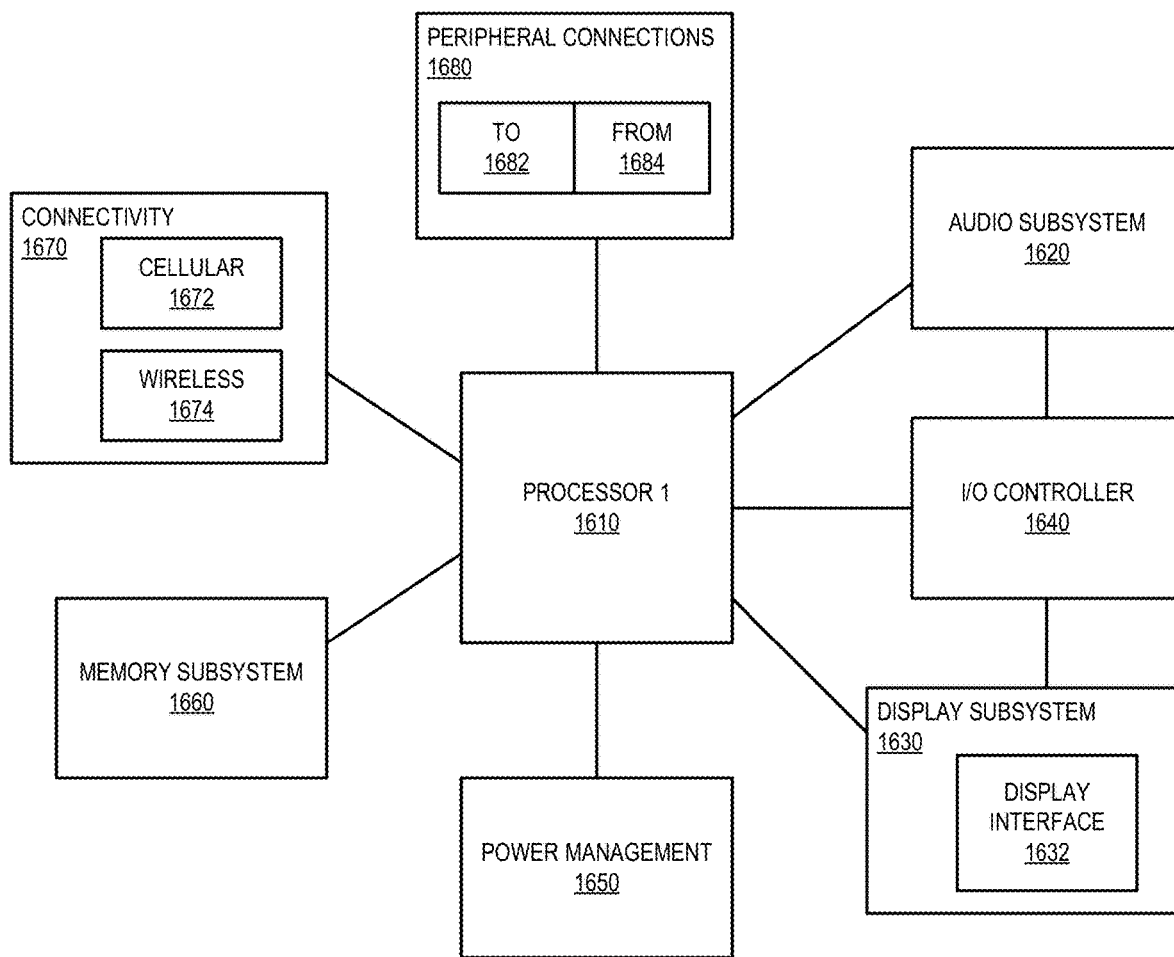
FIG. 8 illustrates a smart device or a computer system or a SoC (System-on-Chip) with a three-terminal device comprising a spin filter, according to some embodiments.

FIG. 8 illustrates a smart device or a computer system or a SoC (System-on-Chip) with a three-terminal device comprising a spin filter, according to some embodiments. FIG. 8 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with a three-terminal device comprising a spin filter, according to some embodiments discussed. Other blocks of the computing device 1600 may also include a three-terminal device comprising a spin filter, according to some embodiments. The various embodiments of the present disclosure may also comprise a network interface within connectivity 1670 such as a wireless interface so that a system embodiment may be incorporated into a wireless device, for example, cell phone or personal digital assistant.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600 or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first stack comprising a magnetic insulating material and a transition metal dichalcogenide;
a second stack comprising a magnetic insulating material and a transition metal dichalcogenide,
  wherein the first and second stacks are separated by an insulating material;
a magnet adjacent to the transition metal dichalcogenides of the first and second stacks, and also adjacent to the insulating material; and
a magnetoelectric material adjacent to the magnet.

2. The apparatus of claim 1, wherein the magnet comprises one or more of: Co, Fe, Ni, or O.

3. The apparatus of claim 1, wherein the magnet is a ferromagnet.

4. The apparatus of claim 1, wherein the magnet comprises one or more of: Pt, Pd, W, Ce, Al, Li, Mg, Na, Cr, O, Co, Dy, Er, Eu, Gd, Fe, Nd, K, Pr, Sm, Tb, Tm, or V.

5. The apparatus of claim 1, wherein the magnet comprises one or a combination of materials comprising one or more of: a Heusler alloy, Co, Fe, Ni, Gd, B, Ge, Ga, permalloy, or Yttrium Iron Garnet (YIG), and wherein the Heusler alloy is a material comprising one or more of: Cu, Mn, Al, In, Sn, Ni, Sb, Ga, Co, Fe, Si, Pd, Sb, Si, V, or Ru.

6. The apparatus of claim 1, further comprising an interconnect adjacent to the magnetoelectric material, wherein the interconnect comprises a material which includes one or more of: Cu, Ag, Al, Au, or graphene.

7. The apparatus of claim 1, wherein magnetoelectric material comprises one of: Cr, O, or multiferroic material, and wherein the multiferroic material comprises one or more of: Bi, Fe, O, Lu, or La.

8. The apparatus of claim 1, wherein the magnet and the magnetic insulating material have in-plane magnetic anisotropy.

9. The apparatus of claim 1, wherein the magnet and the magnetic insulating material have perpendicular magnetic anisotropy.

10. The apparatus of claim 1, wherein the magnetic insulating material of the first or second stacks comprises one or more of: Eu, S, O, Y, Fe, Tm, Ga, Mn, or As.

11. The apparatus of claim 1, wherein the transition metal dichalcogenide of the first or second stacks comprises one or more of: Mo, S, Se, W, Pt, Te, or graphene.

12. A system comprising:
a memory;
a processor coupled to the memory, the processor including a spin filter device comprising:
  a first stack comprising a magnetic insulating material and a transition metal dichalcogenide;
  a second stack comprising a magnetic insulating material and a transition metal dichalcogenide, wherein the first and second stacks are separated by an insulating material;
  a magnet adjacent to the transition metal dichalcogenides of the first and second stacks, and also adjacent to the insulating material; and
  a magnetoelectric material adjacent to the magnet; and
a wireless interface configured to communicate with another device.

13. The system of claim 12, wherein:
the magnetic insulating material of the first or second stacks comprises one or more of: Eu, S, O, Y, Fe, Tm, Ga, Mn, or As;
the transition metal dichalcogenide of the first or second stacks comprises one or more of: Mo, S, Se, W, Pt, Te, or graphene; and
the magnetoelectric material comprises one of: Cr, O, Bi, Fe, Lu, or La;
the magnet comprises one or more of: Pt, Pd, W, Ce, Al, Li, Mg, Na, Cr, O, Co, Dy, Er, Eu, Gd, Fe, Nd, K, Pr, Sm, Tb, Tm, or V; or
the magnet comprises one or a combination of materials comprising one or more of: a Heusler alloy, Co, Fe, Ni, Gd, B, Ge, Ga, permalloy, or Yttrium Iron Garnet (YIG).

* * * * *